(12) United States Patent
Zhao et al.

(10) Patent No.: US 11,476,119 B2
(45) Date of Patent: Oct. 18, 2022

(54) METHOD OF MANUFACTURING A SEMICONDUCTOR STRUCTURE

(71) Applicant: IMEC VZW, Leuven (BE)

(72) Inventors: Ming Zhao, Bertem (BE); Annelies Delabie, Bierbeek (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/375,222

(22) Filed: Jul. 14, 2021

(65) Prior Publication Data

US 2022/0020587 A1    Jan. 20, 2022

(30) Foreign Application Priority Data

Jul. 14, 2020 (EP) .................... 20185786

(51) Int. Cl.
*H01L 21/02* (2006.01)
*H01L 21/308* (2006.01)

(52) U.S. Cl.
CPC .... *H01L 21/02642* (2013.01); *H01L 21/0254* (2013.01); *H01L 21/02381* (2013.01); *H01L 21/02488* (2013.01); *H01L 21/3081* (2013.01)

(58) Field of Classification Search
None
See application file for complete search history.

(56) References Cited

U.S. PATENT DOCUMENTS 8,835,988 B2    9/2014  Marino et al.
9,331,076 B2    5/2016  Bayram et al.
9,640,422 B2    5/2017  Dasgupta et al.
2011/0108850 A1    5/2011  Cheng et al.
2013/0285213 A1    10/2013  Wei et al.

(Continued)

FOREIGN PATENT DOCUMENTS

EP    2634825 A2    9/2013
WO    2019094052 A1    5/2019

OTHER PUBLICATIONS

Extended European Search Report and Written Opinion, Application No. EP20185786.9, dated Dec. 1, 2020, 12 pages.

(Continued)

*Primary Examiner* — Jack S Chen
(74) *Attorney, Agent, or Firm* — McDonnell Boehnen Hulbert & Berghoff LLP

(57) ABSTRACT

A method for manufacturing a semiconductor structure that comprises providing a monocrystalline silicon base layer comprising a first region for manufacturing the III-N semiconductor device and a second region for manufacturing the silicon semiconductor device; providing on the monocrystalline silicon base layer a mask layer, the mask layer being interrupted, in the first region, by a recess in the monocrystalline silicon base layer, wherein the mask layer comprises a 2D material; forming, selectively, a layer of gamma-$Al_2O_3$ at the bottom of the recess by a first growth process; forming, selectively on the layer of gamma-$Al_2O_3$, a III-N semiconductor device stack by a second growth process, and thereafter; manufacturing, in the second region, at least partially a silicon semiconductor device.

16 Claims, 7 Drawing Sheets

(56) References Cited

U.S. PATENT DOCUMENTS

2019/0203054 A1 7/2019 Seki
2022/0020587 A1* 1/2022 Zhao .................. H01L 21/0254

OTHER PUBLICATIONS

Wang, Lianshan, Xianglin Liu, Yude Zan, Jun Wang, Du Wang, Da-cheng Lu, and Zhanguo Wang. "Wurtzite GaN epitaxial growth on a Si (001) substrate using γ-Al 2 O 3 as an intermediate layer." Applied physics letters 72, No. 1 (1998): 109-111.

Lee, W. C., Y. J. Lee, L. T. Tung, S. Y. Wu, C. H. Lee, M. Hong, H. M. Ng, J. Kwo, and C. H. Hsu. "Growth and structural characteristics of Ga N/Al N/nanothick γ-Al 2 O 3/Si (111)." Journal of Vacuum Science & Technology B: Microelectronics and Nanometer Structures Processing, Measurement, and Phenomena 26, No. 3 (2008): 1064-1067.

Ishida, Makoto, Ichiro Katakabe, Tetsuro Nakamura, and Norio Ohtake. "Epitaxial Al2O3 films on Si by low-pressure chemical vapor deposition." Applied physics letters 52, No. 16 (1988): 1326-1328.

Wakahara, Akihiro, Hiroshi Oishi, Hiroshi Okada, Akira Yoshida, Yoshiaki Koji, and Makoto Ishida. "Organometallic apor phase epitaxy of GaN on Si (1 1 1) with a γ-Al2O3 (1 1 1) epitaxial intermediate layer." Journal of crystal growth 236, No. 1-3 (2002): 21-25.

Lee, S. C., B. Pattada, Stephen D. Hersee, Ying-Bing Jiang, and S. R. J. Brueck. "Nanoscale spatial phase modulation of GaN on a V-grooved Si substrate-cubic phase GaN on Si (001) for monolithic integration." IEEE journal of quantum electronics 41, No. 4 (2005): 596-605.

Lee, Ko-Tao, Can Bayram, Daniel Piedra, Edmund Sprogis, Hariklia Deligianni, Balakrishnan Krishnan, George Papasouliotis et al. "GaN devices on a 200 mm Si platform targeting heterogeneous integration." IEEE Electron Device Letters 38, No. 8 (2017): 1094-1096.

* cited by examiner

METHOD OF MANUFACTURING A SEMICONDUCTOR STRUCTURE

CROSS-REFERENCE TO RELATED APPLICATIONS

The present application is a non-provisional patent application claiming priority to European Patent Application No. 20185786.9, filed Jul. 14, 2020, the contents of which are hereby incorporated by reference.

FIELD OF THE DISCLOSURE

The application relates to a method of manufacturing a semiconductor structure and to an intermediate semiconductor structure manufactured therefrom.

BACKGROUND

There is increased interest in monolithically integrating III-N based semiconductor devices with Si-based semiconductor devices.

Combining III-N based semiconductor devices with Si based semiconductor devices on a common base Si substrate can open routes for high power and high-performance electronic device applications and new possibilities for RF integrated circuits.

However, there are technical difficulties in fabricating both types of devices on a common silicon base layer of just one type of crystal orientation being either (111) or (100). This is because Si-based semiconductor devices are typically manufactured on large substrates (200 nm to 300 nm) typically being Si (100) due to the ease of its supply and its convenience for building very large scale integrated (VLSI) circuits.

On the other hand, III-N based semiconductor devices are typically manufactured on sapphire substrates, on SiC substrates or on Si (111) substrates.

Besides, it is difficult to selectively grow III-N based semiconductor devices on Si substrates to allow true monolithic integration with Si based semiconductor devices on that common Si substrate. Furthermore, monolithic co-integration of III-N based semiconductor devices with Si-based semiconductor devices on a common base Si substrate should be made feasible in such a way that the manufacturing should neither jeopardize fab throughput nor process yield.

SUMMARY

Aspects disclosed herein provide suitable methods for monolithically co-integrating III-N based semiconductor devices with Si-based semiconductor devices.

These aspects are accomplished by a method and an intermediate semiconductor structure disclosed herein.

A first aspect relates to a method for manufacturing a semiconductor structure, the semiconductor structure comprising an III-N semiconductor device in a first region and a silicon semiconductor device in a second region, the method comprising:
  providing a monocrystalline silicon base layer comprising a first region for manufacturing the III-N semiconductor device and a second region for manufacturing the silicon semiconductor device,
  providing, on the monocrystalline silicon base layer, a mask layer, wherein the mask layer is interrupted, in the first region by a recess in the silicon base layer, wherein the mask layer comprises a 2D material,
  forming, selectively, a layer of gamma-$Al_2O_3$ at the bottom of the recess by a first growth process,
  forming, selectively on the layer of gamma-$Al_2O_3$, a III-N semiconductor device stack by a second growth process, and thereafter;
  manufacturing, in the second region, at least partially a silicon semiconductor device.

Embodiments of the first aspect facilitate monolithically integrating III-N based semiconductor devices with Si-based semiconductor devices.

Embodiments of the first aspect facilitate monolithically integrating III-N based semiconductor devices with Si-based semiconductor devices, thereby facilitating the manufacturing of devices suitable for RF communication, RF power application and power electronics applications Embodiments of the first aspect facilitate monolithically integrating III-N based semiconductor devices with Si-based semiconductor devices on a common semiconductor base layer.

Embodiments of the first aspect facilitate an increase in the throughput of monolithic integration of III-N based semiconductor devices with Si-based semiconductor devices.

Embodiments of the first aspect facilitate the growth of a III-N semiconductor device stack subsequent to the growth of a crystalline gamma-$Al_2O_3$ layer without interruption.

Embodiments of the first aspect facilitate maintaining the leakage blocking capability of the III-device device.

Embodiments of the first aspect facilitate monolithically integrating III-N based semiconductor devices with Si-based semiconductor devices on a common semiconductor substrate, whereby the reliability of the Si-based semiconductor device is not jeopardized due to the high-temperature budget.

Embodiments of the first aspect facilitate manufacturing the III-N semiconductor device prior to manufacturing the silicon semiconductor device on a common semiconductor substrate.

Embodiments of the first facilitate monolithically integrating III-N based semiconductor devices with Si-based semiconductor devices on a common semiconductor substrate, whereby the temperature budget of manufacturing the III-nitride based semiconductor device does not jeopardize the manufacturing of the Si-based semiconductor device on the common semiconductor substrate.

A second aspect relates to an intermediate semiconductor structure for integrating a III-N semiconductor device with a silicon semiconductor device comprising:
  a monocrystalline silicon base layer,
  a mask layer comprising a 2D material on the monocrystalline silicon base layer being interrupted by a recess, the recess being in the monocrystalline silicon base layer.

Embodiments of the second aspect facilitate the manufacturing of devices suitable for RF communication, RF power application, and power electronics applications.

Embodiments of the second aspect facilitate selective deposition process in the recess thanks to the layer of the 2D material.

Embodiments of the second aspect facilitate the manufacturing of monolithically co-integrated III-N semiconductor devices with a silicon semiconductor device in a fast way, thereby facilitating high throughput of manufacturing and, thus, low cost of manufacturing.

Embodiments of the second aspect facilitate the manufacturing of monolithically co-integrated III-N semiconductor devices with a silicon semiconductor device on a common semiconductor substrate.

In embodiments of the second aspect, the thermal budget for manufacturing the III-N semiconductor device does not jeopardize the device reliability and device manufacturability of the silicon semiconductor device.

Particular aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics and features will become apparent from the following detailed description, taken in conjunction with the accompanying drawings, which illustrate, by way of example, various principles. This description is given for the sake of example only, without limiting the scope of the claims. The reference figures quoted below refer to the attached drawings.

BRIEF DESCRIPTION OF THE FIGURES

The above, as well as additional features, will be better understood through the following illustrative and non-limiting detailed description of example embodiments, with reference to the appended drawings.

Figure 1:
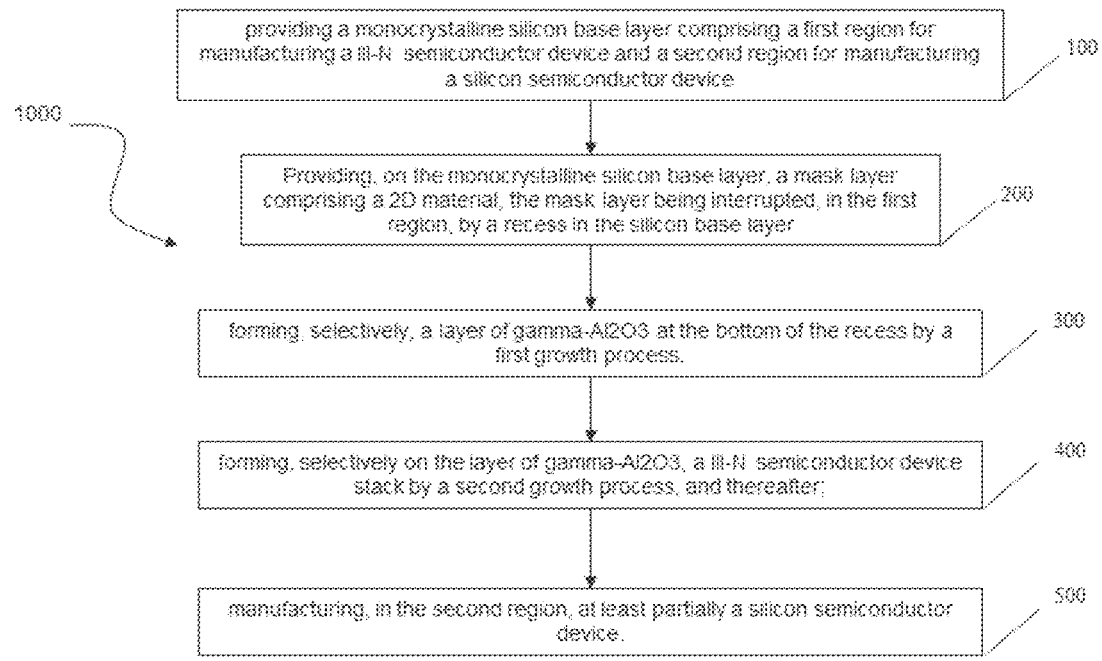
FIG. 1 is a flowchart representing a method, according to example embodiments of a first aspect.

The drawings described are only schematic and are non-limiting. In the drawings, the size of some of the elements may be exaggerated and not drawn on scale for illustrative purposes. The dimensions and the relative dimensions do not correspond to actual reductions to practice of aspects herein. In the different figures, the same reference signs refer to the same or analogous elements. All the figures generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising," used in the claims, should not be interpreted as being restricted to the terms listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising," therefore, also includes as one embodiment that no further components are present. Thus, the scope of the expression "a device comprising means A and B" should not be interpreted as being limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments, various features are sometimes grouped in a single embodiment, figure, or description thereof for brevity and aiding in the understanding of one or more of the various aspects. This method of disclosure, however, is not to be interpreted as reflecting an intention that the claims require more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some, but not other features included in other embodiments, combinations of features of different embodiments are meant to be within the scope of the claims, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the aspects disclosed herein.

In the description provided herein, numerous specific details are set forth. However, it is understood that embodiments may be practiced without these specific details. In other instances, well-known methods, structures and techniques have not been shown in detail in order not to obscure an understanding of this description.

The following terms are provided solely to aid in the understanding of the aspects disclosed herein.

As used herein, and unless provided otherwise, leakage-blocking capability refers to facilitating the control of the leakage current from the top to the substrate, whereby the device is usually biased at 50-100V or higher (for high voltage power) at the top of the stack.

As used herein, and unless provided otherwise, RF communication applications refer to applications using RF power amplifiers, RF switches, etc.

As used herein, and unless provided otherwise, RF power application refers to an application using RF heating.

As used herein, and unless provided otherwise, power electronics application refers to an application dealing with power conversion.

As used herein, and unless provided otherwise, interrupted mask layer refers to the mask layer having a discontinuity.

As used herein, and unless provided otherwise, topography refers to the configuration or arrangement of physical features on a surface, such as, for instance, the surface having concave or convex features or being flat in some parts.

As used herein, and unless provided otherwise, monolithic integration refers to using different device components to form integrated circuits that are built on a single semiconductor base material or single chip.

The disclosure will now be described by a detailed description of several embodiments of the disclosure. It is clear that other embodiments can be configured according to the knowledge of persons skilled in the art without departing from the technical teaching of the disclosure.

We now refer to FIG. 1 showing a flowchart representing a method (1000) according to a first aspect and FIG. 2 and FIG. 3 showing a schematic representation of the process steps, in sequential order, as used in embodiments of the first aspect.

Figure 2A:
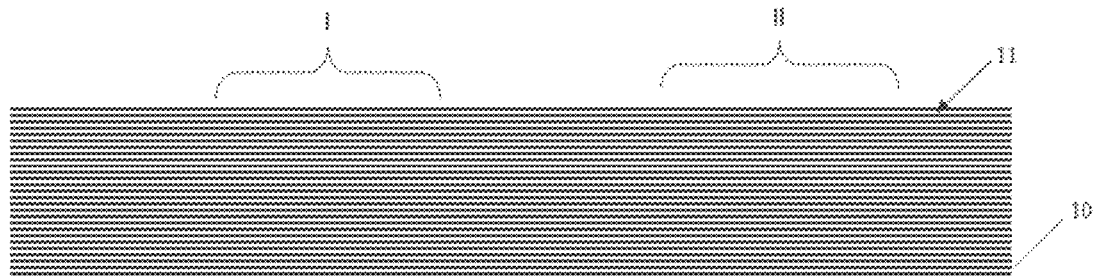
FIG. 2a to FIG. 2h show schematic representations of process steps, in sequential order, as used in example embodiments of the first aspect.
Figure 3A:
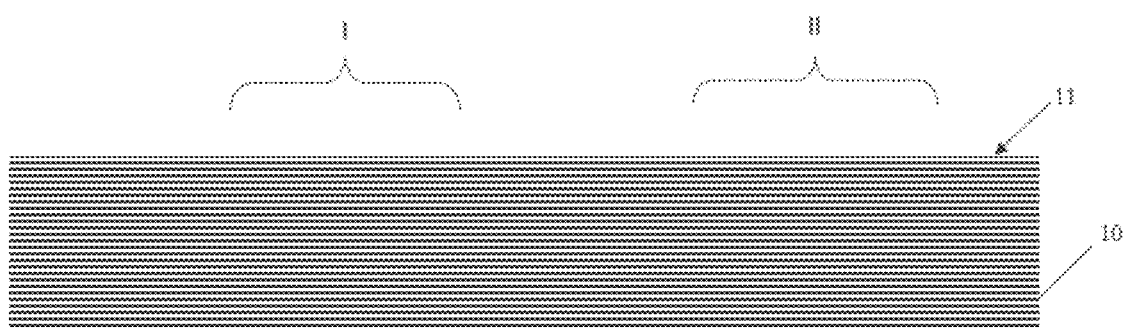
FIG. 3a to FIG. 3h show schematic representations of process steps, in sequential order, as used in another example embodiment of the first aspect.
Figure 3B:
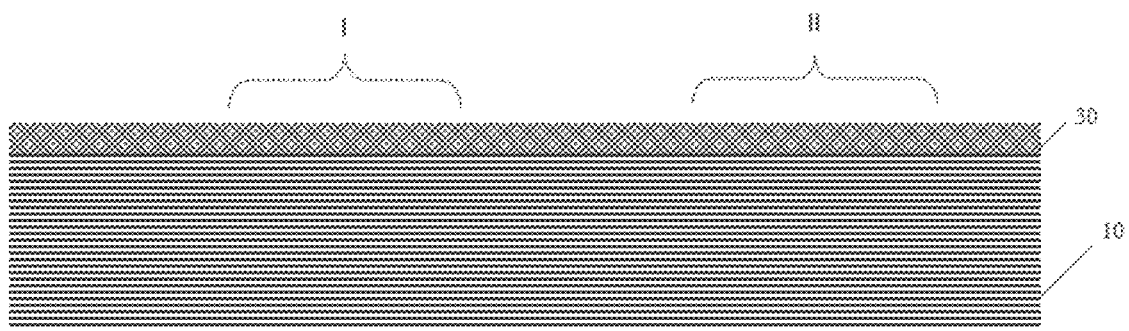

The method (1000) comprises providing (100) a monocrystalline silicon base layer (10). This layer comprises a first region (I) for manufacturing a III-N semiconductor device and a second region (II) for manufacturing a silicon semiconductor device (FIG. 2a and FIG. 3a).

In embodiments, the monocrystalline silicon base layer (10) may be a Si (111) layer or a Si (100) layer. Using the Si (100) layer simplifies the fabrication of the Si semiconductor device. However, either Si (111) or Si (100) layer can be used to accommodate the monolithic integration of the III-N semiconductor device with the Si semiconductor device, thanks to the method.

In embodiments, the monocrystalline silicon base layer (10) may be comprised in a substrate and provided on an insulator layer. This monocrystalline silicon base layer is then referred to as a silicon on insulator (SOI) layer. The insulator layer may be a layer of an oxide, such as a layer of silicon oxide. This substrate may further comprise a silicon bulk layer underneath the insulator layer. The silicon bulk layer may have (111) orientation. The monocrystalline silicon base layer comprised in this substrate may be (100) oriented.

The method (1000) then comprises providing (200) a mask layer (30) on the monocrystalline silicon base layer (10) (FIG. 1). This mask layer (10) comprises a 2-dimensional (2D) material and it is interrupted (31).

The mask layer (30) comprising the 2D material can be provided on the monocrystalline silicon base layer (10) by, for instance, a chemical vapor deposition (CVD) process that is performed at temperatures higher than 700° C., such as for instance, at a temperature between 900° C. to 1000° C. In such a process, a hydrocarbon precursor, such as for instance, methane can be used. A metal layer needs to be provided on the monocrystalline silicon base layer (10) prior to the CVD process to act as a catalyst to facilitate the CVD growth of the layer of the 2D material.

Alternatively, the layer of the 2D material (30) can be grown on a separate substrate. This layer can then be transferred on to the monocrystalline silicon base layer (10) by a transfer technique. In order to avoid delamination of the layer of the 2D material (30) from the monocrystalline silicon base layer, an adhesion layer needs to be provided on the monocrystalline silicon base layer (10) prior to the transfer process.

The use of a mask layer comprising a 2D material, which is interrupted (31), facilitates the manufacturing of the III-N semiconductor device prior to the manufacturing of the silicon semiconductor device. The provision of this mask layer (30) is easier on the monocrystalline silicon base layer (10) either by performing the CVD process such as mentioned above or by transfer from another substrate and even a single layer of a 2D material would be sufficient to act as the mask layer (30). Furthermore, in case this provision is done by growing the mask layer comprising the 2D material (30) by performing a CVD process, the monocrystalline silicon base layer is to be subjected to temperatures higher than 700° C., which can be detrimental for a prior existing silicon semiconductor device due to such high thermal budget.

Thus, because the III-N semiconductor device can be manufactured prior to the manufacturing of the silicon semiconductor device, device reliability of the silicon semiconductor device is not jeopardized. Should the silicon semiconductor device be manufactured prior to the manufacture of the III-N device, the provision of a layer comprising a 2D material as the mask layer (30) could not be realized without increasing the manufacturing cost or without jeopardizing the enablement of high throughput for monolithic integration of these devices. This would be due to the fact that there would be a demand for a sufficiently thick mask layer in order to cover the existing topography due to the presence of a pre-existing silicon semiconductor device or the monolithic integration would require additional process steps to provide a surface with reduced topography suitable for the provision of the layer of the mask layer comprising the 2D material. All these additional measures would, therefore, increase the manufacturing cost or decreases the throughput for monolithic integration of these devices.

Figure 2B:
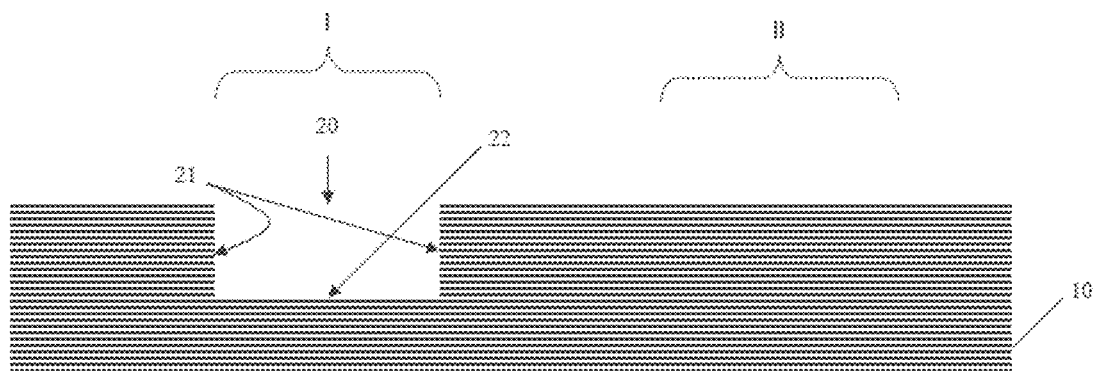
Figure 2C:
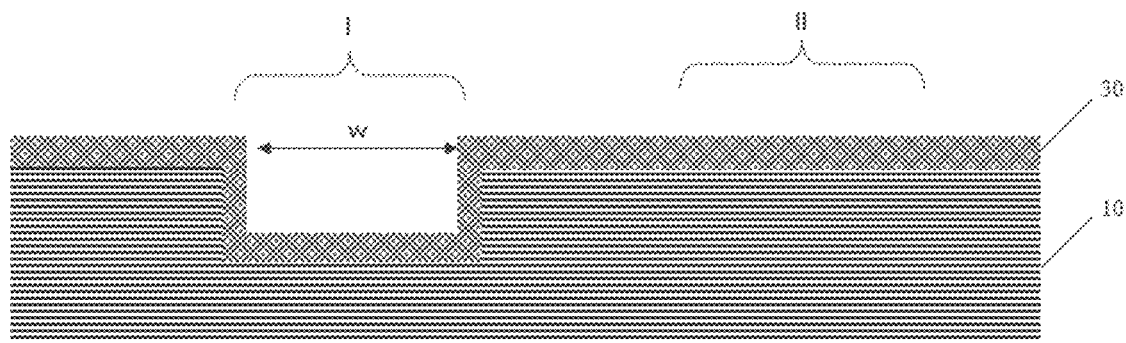
Figure 2D:
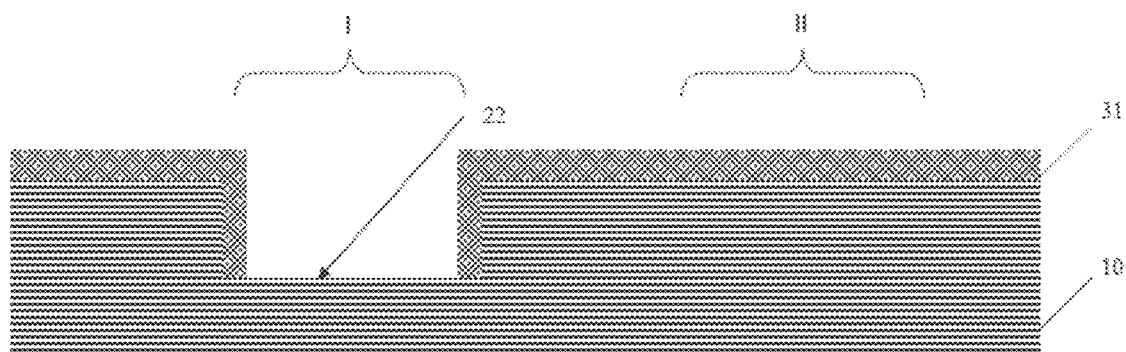
Figure 2E:
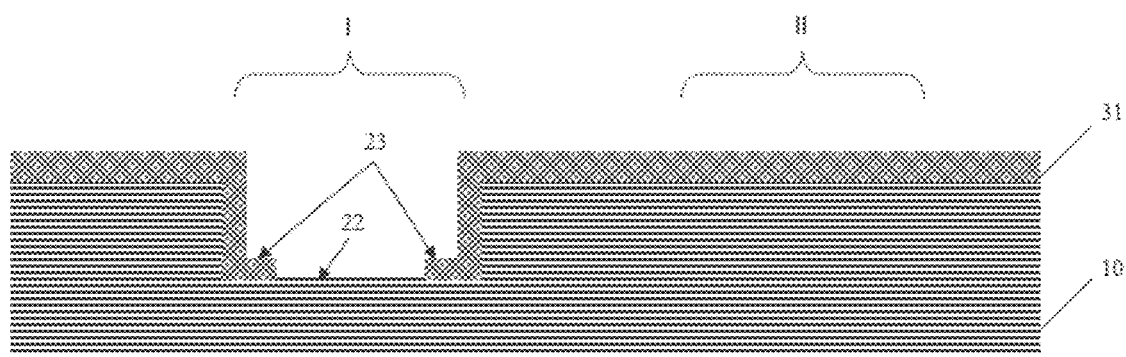
Figure 3C:
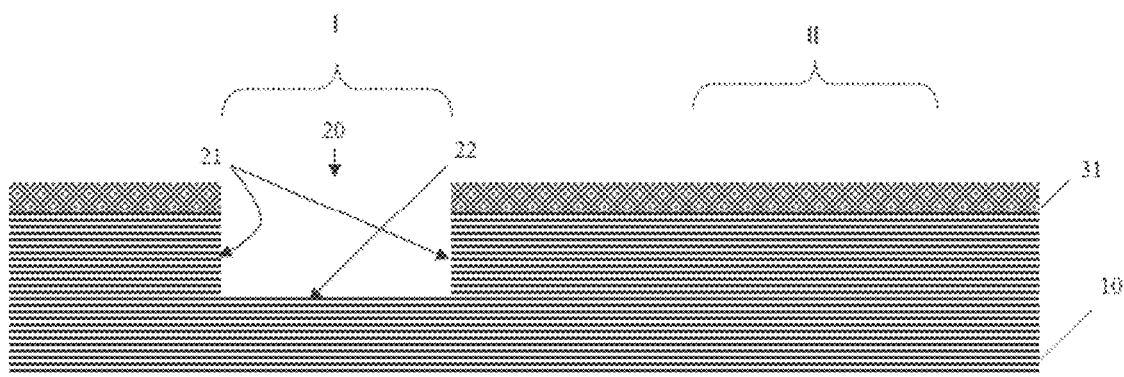

This mask layer is interrupted (31), such as, for instance, shown in FIG. 2d and in FIG. 3c, in the first region (I) by a recess (20) in the monocrystalline silicon base layer (10). Interrupted mask layer (31). As such, this implies that the continuity of the mask layer is broken. This recess has sidewalls (21) and a bottom (22). This recess (20) is to be used for the manufacturing of a III-N semiconductor device. The depth of the recess (20) may, thus, be tailored according to the technological requirements for the manufacturing of the III-N semiconductor device. The width of the recess may range from a hundred nanometers to a few tens of micrometers or up to 100 nm or higher.

The interrupted mask layer (31) comprises a 2D material since the unique structure of 2D material results in a highly inert, trap-free basal surface. This facilitates, in turn, the formation of the layer of gamma $Al_2O_3$ (50) selectively at the bottom of the recess (20) since the inert surface of the mask layer comprising the 2D material will avoid the nucleation and hence further deposition of the layer of gamma $Al_2O_3$ (50). Furthermore, the formation of the III-N semiconductor device stack (40) will also be selectively done on the layer of gamma $Al_2O_3$ (50) in the recess (20), again thanks to the inert surface of the mask layer comprising the 2D material. These selective depositions that are facilitated due to the presence of this interrupted mask layer (31) comprising the 2D material lead to a low cost of manufacturing. This is because these aspects cut off the necessity for additional processes, which otherwise would have been necessary to remove these layers from undesired locations occurring due to non-selectivity. Such non-selectivity would, for example, lead to the deposition of the layer of gamma $Al_2O_3$ (50) also on the exposed portion of the mask layer that is disposed on the top surface (11) of the monocrystalline silicon base layer (10).

In embodiments, a single layer of 2D material may be sufficient to act as the mask layer.

In 2D materials, two dimensions are outside the nanoscale and one dimension is only a single, such as in graphene, or more than one, such as in hexagonal BN or transition metal dichalcogenides, atomic layers thick. The thickness of 2D materials is different for different materials due to the fact that lattice constants are different. For example, for WS2, the W atom is covalently bonded to two S atoms within each individual layer, whereas van der Waals interactions govern in between two individual layers. The layer thickness of a single layer of WS2 is 0.615 nm.

Single layers are obtained by exfoliation or by vapor phase transfer, chemical vapor deposition or molecular beam deposition.

In embodiments, the mask layer may be a multi-layer stack of 2D materials. The top-most layer of this multi-layer stack can absorb any damage that may be caused as a result of an etch process that is comprised in a patterning process. A patterning process typically comprises performing a lithography process comprising photoresist coating, exposure and development of the photoresist. The process further comprises performing an etch process to remove the material that does not follow the pattern identified by the exposed and developed photoresist in the lithography process. Thus, the aforementioned damage in the top-most layer can be caused by the etch process, which is comprised in the patterning process, in order to form the interrupted mask layer (31).

Such damage can also be caused, in embodiments, by the etch process, which is comprised in the patterning process used to interrupt the mask layer (FIG. 2d). In these embodiments, the mask layer is interrupted (31) such that it is not present at the bottom (22) of the recess (20). Thus, due to the mask layer being a multi-layer stack of 2D materials, the layers of 2D material underneath the top-most layer are still highly inert and have a trap-free basal surface.

Such damage in the top-most layer can be caused, in other embodiments, by the etch process, which is comprised in the patterning process, in order to interrupt the mask layer, which leads to the formation of the recess (20) in the monocrystalline silicon base layer (FIG. 3c). Si etching may be done as known to a person skilled in the art, such as, for instance, by dry etching and using $SF_6/O_2$ chemistry or by $Cl_2/HBr$ chemistry. In these embodiments, the mask layer is interrupted (31) such that it is not present on the sidewalls (21) and at the bottom (22) of the recess (20).

In embodiments, the multi-stack layer may consist of layers of the same 2D material. In alternative embodiments, the multi-stack layer may have alternating layers of two different 2D materials.

In embodiments, the mask layer may comprise a top-most layer comprising a dielectric material. This dielectric material-comprising top-most layer may be provided on a single layer of a 2D material or on a multi-layer stack of 2D materials.

Having this dielectric material-comprising the top-most layer during a patterning step that comprises a lithography process and an etch process facilitates absorbing any possible damage that may be caused by the etch process. This protects the layer or layers of 2D materials underneath this top-most layer comprising the dielectric material.

In embodiments, this dielectric material may be a high-k dielectric material deposited by an atomic layer deposition (ALD) process. Provision of this high-k dielectric material facilities a mild deposition through the ALD in the temperature range of room temperature up to 300° C. such that the 2D material is not damaged. In this ALD process, short purge times and such low temperatures are beneficial since nucleation on the inert basal planes of 2D materials can be enabled at low temperatures due to contributions from physisorption.

In embodiments, the interruption of the mask layer (31) can be due to the fact that the mask layer (30) is not present at the bottom (22) of the recess (20), such as, for instance, shown in FIG. 2d.

In these embodiments, the recess (20) may be formed before providing the mask layer (30) on the monocrystalline silicon base layer (10), such as shown, for instance, in FIG. 2b. A patterning process may be performed comprising a lithography process followed by an etch process in order to make the recess (20) in the first region (I) in the monocrystalline silicon base layer (10). Si etching may be done as known to the person skilled in the art, such as, for instance, by dry etching and using $SF_6/O_2$ chemistry or by $Cl_2/HBr$ chemistry. In these embodiments, the mask layer (30) may be deposited conformally on the monocrystalline silicon base layer (10). This conformal mask layer then covers the top surface of the monocrystalline silicon base layer (10) and the sidewalls (21) and bottom (22) of the recess (20) (FIG. 2c). This conformal deposition of the layer of the 2D material, in these embodiments, may be done by a chemical vapor deposition (CVD) process that can be performed at temperatures higher than 700° C., such as for instance, at a temperature between 900° C. to 1000° C., since conformal provision of the layer of 2D material by a transfer process in these embodiments could be cumbersome. A hydrocarbon precursor, such as for instance, methane can be used to form the layer of 2D material. A metal layer needs to be provided on the monocrystalline silicon base layer (10) prior to the CVD process to act as a catalyst to facilitate the CVD growth of the layer of the 2D material. This metal layer can, such as for instance, be copper for growing graphene monolayer and nickel for growing multi-layers of 2D materials.

Another patterning process comprising a lithography process followed by an etch process may be performed to remove the mask layer (30) from the bottom (22) of the recess (20), thus interrupting the mask layer (30) and thereby exposing the monocrystalline silicon base layer at the bottom (22) of the recess (20), such as shown, for instance, in FIG. 2d. In embodiments where the mask layer is a multi-layer stack of 2D materials, a top-most layer of the multi-layer stack is, in an example, to be removed after performing the etch process. This top-most layer is likely to be damaged due to the etch process and its removal facilitates exposing a pristine layer of 2D material having highly inert surface and having a trap-free basal surface.

During the lithography process used to interrupt the mask layer (30) (FIG. 2d), a lithography mask having an opening with a width that is smaller than the width (w) of the recess (30) after provision of the conformal layer of the 2D material (FIG. 2c) can be used. This avoids the removal of the layer of the 2D material (30) by the etch process from regions falling outside the recess (20). This can be caused by alignment problems that can occur during the lithography process comprised in the patterning process used for interrupting the mask layer (30). This can lead to non-selectivity problems during the upcoming deposition processes. Patterning with such a lithography mask, thus, leads to the formation of two necks (23) of the layer of the 2D material (30) at the bottom (22) of the recess (20), such as shown, for instance, in FIG. 2e. The provision of the layer of gamma $Al_2O_3$ (50) can proceed to start at the bottom of the recess (20) on the exposed monocrystalline silicon base layer (10) and proceed by selective lateral overgrowth. Where the width of the recess (20) is on the order of a hundred nanometers or a few hundreds of nanometers, the width of the opening of the lithography mask may be 10 to 95 percent of the width of the recess (20). For example, for a recess with a width of 100 nm, the opening of the lithography mask may be in the range of 10 nm to 95 nm. With a mask opening of 10 nm, deposition of the layer of gamma $Al_2O_3$ (50) can proceed to start at the bottom of the recess (20), while with a mask opening of 95 nm, alignment problems can also be handled while facilitating the deposition of the layer of gamma $Al_2O_3$ (50) at the bottom of the recess (20).

Where the width of the recess (20) is on the order of few tens of micrometers or up to 100 nm or higher, the width of the opening of the lithography mask may be 5 to 99 percent of the width of the recess (20).

In alternative embodiments, the interruption of the mask layer (30) can also be due to the fact that it is not present on the sidewalls (21) and at the bottom (22) of the recess (20), such as, for instance, shown in FIG. 3c.

In these alternative embodiments, the mask layer (30) may be provided on the monocrystalline silicon base layer (10) (FIG. 3b) before performing the patterning process to form the recess (20). In these embodiments, the mask layer (30) may be provided on the monocrystalline silicon base layer (10) either by the aforementioned CVD process or by the aforementioned transfer process.

Performing the patterning process comprising a lithography process followed by an etch process then leads to the formation of the recess (20) (FIG. 3c). This etch process is typically a dry etch process and is executed as known to the person skilled in the art, such as, for instance, by dry etching and using $SF_6/O_2$ chemistry or by $Cl_2/HBr$ chemistry. This interrupts the mask layer (30), and thereby exposes the monocrystalline silicon base layer (10) at the sidewalls (21) and at the bottom (22) of the recess (20). In some embodiments, the bottom (22) of the recess (20) lies parallel to the top surface (11) of the monocrystalline silicon base layer (10).

After interrupting the mask layer, one or more layers from a top of the mask layer (30) may be removed. This removal is done so as to leave at least one layer in the mask layer. This removal may be done by performing an atomic layer etching in order to provide removal with atomic layer precision. Removal of the one or more layers from a top of the mask layer (30) eliminates the aforementioned damaged top-most layer. This damaged top-most layer, in some embodiments, may correspond to the top-most layer comprising the dielectric material, which itself is comprised in the mask layer. In embodiments, where this top-most layer is provided on a single layer of 2D material, its removal leads to the exposure of the highly inert, trap-free basal surface of the 2D material that is protected.

In other embodiments, where this top-most layer comprising the dielectric material is provided on a multi-layer stack of 2D materials, its removal also leads to the exposure of the highly inert, trap-free basal surface of the 2D material that is protected. In order to remove this top-most layer comprising the dielectric material, the use of a selective etch chemistry facilitates protecting the 2D material that is to be exposed after its removal. In these other embodiments, a further layer or layers of the 2D material may be removed from the multi-layer stack of 2D materials, such as, for instance, by performing an atomic layer etching process. Thus, removal of the damaged top-most layer of the multi-layer stack then exposes an undamaged top surface of the remaining part of the multi-layer stack, thereby maintaining the possibility to perform the selective depositions needed in the recess (20) such as shown, for instance, in FIG. 2f or FIG. 3d.

In embodiments, where the mask layer is provided on the monocrystalline silicon base layer before forming the recess (20), the interruption of the mask layer exposes the monocrystalline silicon base layer on the sidewalls (21) and at the bottom (22) of the recess (20). (FIG. 3a to FIG. 3c) In these embodiments, interruption is obtained due to the forming of the recess (20) in the monocrystalline silicon base layer (10). In these embodiments, a layer of a passivating material may be provided on the sidewalls (21) of the recess (20) before forming, selectively, the layer of gamma-$Al_2O_3$ (50) (FIG. 3e). The layer of the passivating material eliminates the interaction of the precursors used during the formation of the layer of gamma-$Al_2O_3$ and/or the formation of the III-N semiconductor device stack with the monocrystalline silicon base layer (10). The formation of these layers can be done by a molecular beam epitaxy (MBE) process or by metal organic chemical vapor deposition (MOCVD) process. If the interaction of the precursors with the monocrystalline silicon base layer is not avoided, it can lead to the formation of defects in the monocrystalline silicon base layer (10), which then degrades the electrical and structural reliability of the III-N semiconductor device.

Figure 2F:
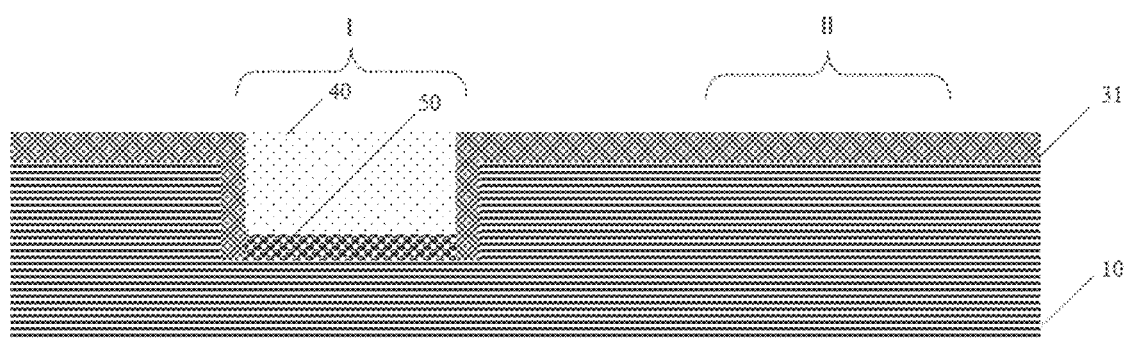
Figure 2G:
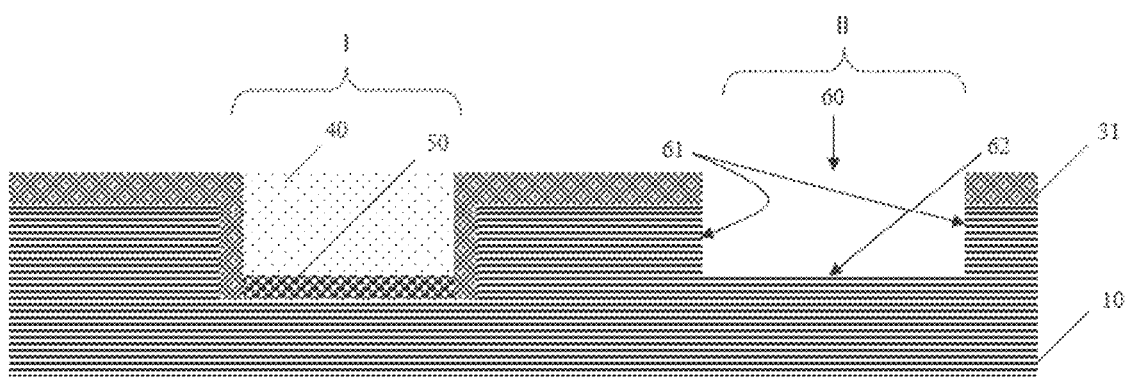

In some embodiments, the then-obtained top-most layer, which is obtained after removal of the damaged top-most layer of the multi-layer stack, can further be damaged as a result of the patterning process used to remove the layer of a passivating material from the bottom (22) of the recess (20) (FIG. 3e), again mainly due to the etch process that is comprised in the patterning process. Removal of this damaged top-most layer prior to carrying out the selective deposition of the layer of gamma-Al$_2$O$_3$ (50) prevents exposure of the highly inert trap-free basal surface of the layer of the 2D material underneath that could occur if removal of the damaged top-most layer were to occur later, and further facilitates the deposition of the III-N semiconductor device stack (FIG. 2f or FIG. 3f).

The formation of the layer of gamma-Al$_2$O$_3$ (50) can be done by MOCVD using TMAl and N$_2$O as precursors at around 1000° C.

It can also be done by MBE using Al and N$_2$O as source material and at a temperature, which is typically around 800° C.

In embodiments, the provision of the layer of the passivating material on the sidewalls comprises providing a conformal layer of the passivating material (70) on the sidewalls (21) and at the bottom (22) of the recess (20). In embodiments, this provision may be done by performing an ALD process. Theoretically, the ALD process leads to the provision of the layer of the passivating material (70) on the sidewalls (21) and bottom (22) of the recess (20) as well as on the interrupted mask layer (31). In this case, an extra patterning process comprising a lithography process and an etch process can be performed to remove the layer of the passivating material from the top of the interrupted mask layer (31). Alternatively, by employing an anisotropic etch process, the layer of the passivating material (70) can be removed from the horizontal surfaces in one step, such as, for instance, removing it from the top of the interrupted mask layer (31) and from the bottom (22) of the recess (20). Alternatively, depending on the type of the passivating material, the layer of the passivating material (70) can be provided only on the sidewalls (21) and bottom (22) of the recess (20), such as, for instance, when aminosilanes are used. In alternative embodiments, using a passivating material that helps to passivate defects on the interrupted mask layer (31) can be used when deposited by ALD conformally on the interrupted mask layer (31) and inside the recess (20). In these alternative embodiments, the layer of the passivating material can be kept on the interrupted mask layer (31) due to this effect. Removing the layer of the passivating material (70) from the bottom (22) of the recess (20) then exposes the monocrystalline silicon base layer (10) (FIG. 3e). This removal can be done by another patterning step comprising a lithography process and an etch process.

Figure 3D:
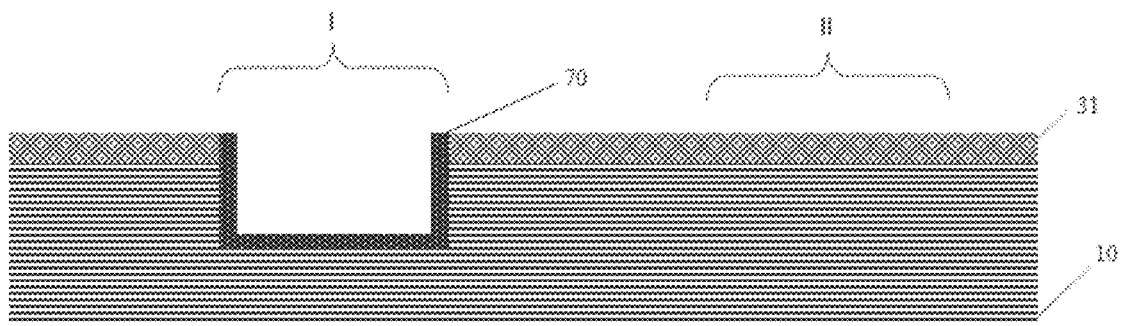
Figure 3E:
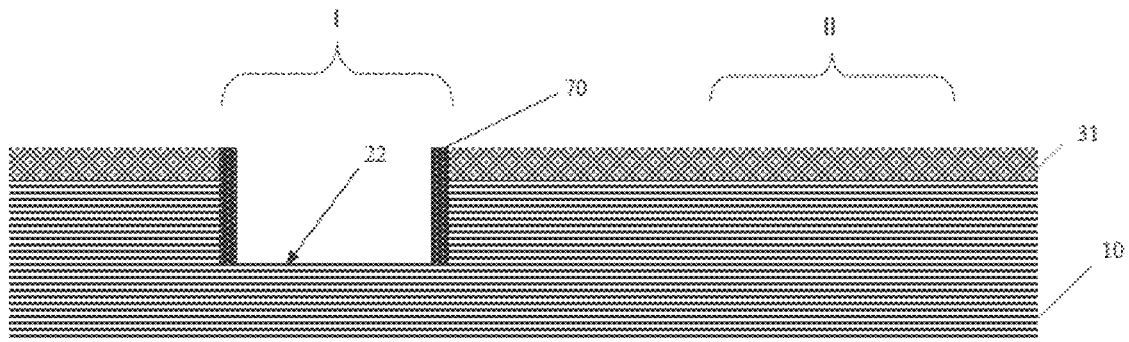
Figure 3F:
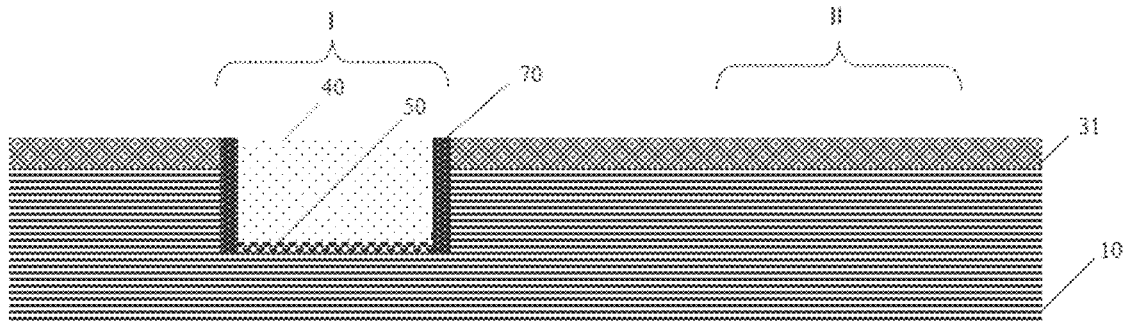
Figure 3G:
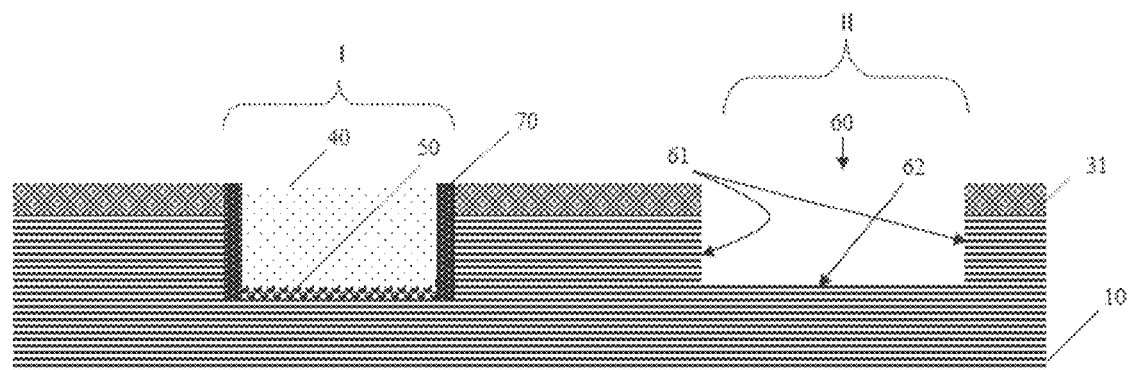

In embodiments, during the lithography process, a lithography mask having an opening with a width that is smaller than the width (w) of the recess (30) after provision of the conformal layer of the passivating material (70) can be used, such as for instance going from FIG. 3d to FIG. 3e. This avoids damage to or removal of the layer of the passivating material (70) on the sidewalls (21) that may originate from alignment issues during the lithography process. This can lead to interaction of the precursors used during the deposition of the layer of gamma Al$_2$O$_3$ and/or the III-N semiconductor device stack in the recess (20).

Such a lithography process done by using a lithography mask having an opening with a width that is smaller than the width (w) of the recess (30) leads to the formation of two necks of the layer of the passivating material at the bottom (22) of the recess (20) (not shown in the figures). The provision of the layer of gamma Al$_2$O$_3$ (50) can proceed to start at the bottom of the recess (20) on the exposed monocrystalline silicon base layer (10) and proceed by selective lateral overgrowth.

Where the width of the recess (20) is on the order of a hundred nanometers or a few hundreds of nanometers, the width of the opening of the lithography mask may be 10 to 95 percent of the width of the recess (20). For example, for a recess with a width of 100 nm, the opening of the lithography mask may be in the range of 10 nm to 95 nm. With a mask opening of 10 nm, deposition of the layer of gamma Al$_2$O$_3$ (50) can proceed to start at the bottom of the recess (20), while with a mask opening of 95 nm, alignment problems can also be handled while facilitating the deposition of the layer of gamma Al$_2$O$_3$ (50) at the bottom of the recess (20).

Where the width of the recess (20) is on the order of few tens of micrometers or up to 100 nm or higher, the width of the opening of the lithography mask may be 5 to 99 percent of the width of the recess (20).

In these embodiments, before removing (FIG. 3e) the layer of the passivating material (70) from the bottom (22) of the recess (20) by an etch process comprised in a patterning process, a layer of a dielectric material acting as a sacrificial material may be provided on the interrupted mask layer (31) in case the mask layer (30), such as, for instance, shown in (FIG. 3b) comprised a top-most layer comprising a dielectric material provided on a single layer of a 2D material. This is because, following the interruption of the mask layer (30) to create the interrupted mask layer (31) (FIG. 3c), this top-most layer comprising the dielectric material, which absorbed any possible damage due to the etch process is removed, in order to expose the pristine surface of the 2D material to facilitate the selective deposition of the layer of the passivating material on the sidewalls (22) and at the bottom (21) of the recess (20). Therefore, before moving on to the removal of the layer of the passivating material (70) from the bottom (22) of the recess (20) (FIG. 3e), provision of such a layer of a dielectric material acting as a sacrificial layer facilitates protecting the interrupted mask layer (31) during the etching process comprised in the patterning process. A layer of a high-k dielectric material may be provided by ALD, selectively on the interrupted mask layer (31) at a temperature in the temperature range of room temperature to 300° C. so that the 2D material of the interrupted ask layer (31) is not damaged during its provision.

In embodiments, this passivating material may be the same as or different from the 2D material comprised in the mask layer.

In embodiments, where interruption of the mask layer (30) is done by removing the mask layer (30) selectively from the bottom (22) of the recess (20) once it has been deposited conformally on the monocrystalline silicon base layer after forming the recess (20) (FIG. 2d) or in embodiments, where a layer of a passivating material (70) is provided on the sidewalls (21) of the recess (20) (FIG. 3e), the method (1000) further comprises, forming (300) selectively, a layer of gamma Al$_2$O$_3$ (50) at the bottom of the recess (22) by a first growth process (FIG. 1). Thanks to the inert surface of the mask layer (30), the layer of gamma Al$_2$O$_3$ (50) can be deposited only at the bottom (22) of the recess (20). This removes the necessity to perform another process in order to get rid of the gamma Al$_2$O$_3$ (50) that would otherwise be deposited also on the interrupted mask layer (31). This then increases the throughput of the manufacturing of the semiconductor structure.

The method (1000) further comprises forming (400), selectively, on the layer of gamma Al$_2$O$_3$ (50), a III-N semiconductor device stack (40) by a second growth process (FIG. 2f and FIG. 3f).

The formation of the layer of gamma Al$_2$O$_3$ (50) and the III-N semiconductor device stack (40) can be done by a molecular beam epitaxy (MBE) process or by metal organic chemical vapor deposition (MOCVD) process, as known to persons skilled in the art.

In embodiments, the first growth process and the second growth process may be performed as a single in situ growth process. In embodiments, this in situ growth process may be performed in one and the same process tool. In embodiments, this in situ growth process may be performed in different chambers or different clusters of the same tool. In alternative embodiments, this in situ process may be performed in one and the same chamber or cluster of the same tool. Performing these two processes in situ facilitates the forming of the III-N semiconductor device stack (40) without breaking the vacuum and thus without changing the process tool. While this increases the throughput of the manufacturing process, it also avoids the risk of damaging or contaminating the layer of gamma $Al_2O_3$ (50), since air exposure is eliminated. Unavoidable air exposure can lead to contamination of the surface of the layer of gamma $Al_2O_3$ (50) in the form of particle contamination or alteration of the surface chemistry. Such kind of undesired contamination can then lead to problems in the second growth process, which is used to form the III-N semiconductor device stack (40).

In alternative embodiments, the first and the second growth process may be performed without in situ and in different process tools.

In embodiments, the 2D material comprised in the mask layer (30) may be graphene, which is, in fact, a two-dimensional sheet of carbon atoms arranged in hexagonal rings. Graphene is stable up to high temperatures such as above 1000° C. Deposition of the layer of gamma $Al_2O_3$ (50) and the III-N semiconductor device stack (40), which occurs after provision of the interrupted mask layer (31), is typically performed at temperatures around or above 1000° C.

In embodiments, this single in situ growth process may be performed at a temperature lower than 1000° C. This widens the options of 2D materials comprised in the mask layer (30) and side wall passivation layer.

Thus, in embodiments where the in-situ growth process is performed at a temperature lower than 1000° C., the 2D material comprised in the mask layer (30) may be a 2D transition metal dichalcogenide (TMDC). 2D TMDC materials are denoted by the formula $MX_2$, where M denotes a transition metal such as, for instance, W, Mo and X denotes a chalcogen, for instance, a non-metal of the oxygen group such as for instance, S, Se, or Te.

$MX_2$ is composed of a single metal layer sandwiched between two chalcogen atomic layers (or planes), which are each arranged in a 2D hexagonal honeycomb structure. 2D TMDC materials show inertness similar to graphene, and therefore, they will also facilitate selective deposition of the layer of gamma $Al_2O_3$ (50) and the III-N semiconductor device stack (40) in the recess (20).

In embodiments, where a layer (70) of passivating material may be provided (FIG. 3e) on the sidewalls, this layer of passivating material may be a layer comprising mono alkyl silyl, di alkyl silyl, or tri alkyl silyl.

Provision of a layer of passivating material comprising mono alkyl silyl, di alkyl silyl, or tri alkyl silyl facilitates obtaining sub-nanometer thickness passivation layers. Furthermore, silylating gas-phase treatments may be integrated in the same process chamber as the subsequent deposition process, which further facilitates manufacturing. Thus, in embodiments, silylating gas phase treatments maybe performed in one and the same process tool as that of the in-situ growth process. This may require adjustment of the process temperature accordingly depending on whether silylating gas phase treatment or the in-situ growth process is taking place. This technique can be used in embodiments where the in-situ growth process may be performed at a temperature lower than 1000° C. since silylating gas phase treatments can typically be performed at a temperature in the range of 200° C. to 300° C.

In embodiments, the layer of the passivating material comprising mono alkyl silyl, di alkyl silyl, or tri alkyl silyl may extend outside the recess (20) and on the mask layer (30). In these embodiments, such a layer can be deposited conformally on the surface, such that it covers the monocrystalline silicon base layer (10) that is exposed on the sidewalls (21) and at the bottom (22) of the recess (20) and on the top-most surface of the mask layer (30) (FIG. 3c), thus extending outside the recess (20). This also aids in passivating or repairing the defects that could have formed on the mask layer (30). Such defects can be formed on the mask layer (30) while removing one or more layers from a top of the mask layer that is done so as to leave at least one layer in the mask layer (30). Due to this passivating or repairing effect on the mask layer (30), selectivity of formation of the layer of gamma $Al_2O_3$ (50) and formation of the III-N semiconductor device stack (40) is maintained.

In alternative embodiments, the alkyl silyl can indeed be deposited selectively on the sidewalls and bottom by self-limiting precursor exposures, such as, for instance, dimethyl amino tri methyl silane DMATMS).

Figure 2H:
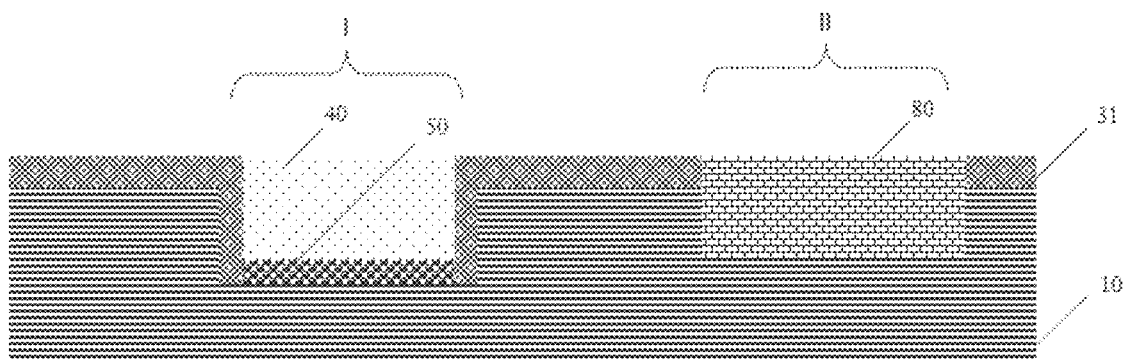
Figure 3H:
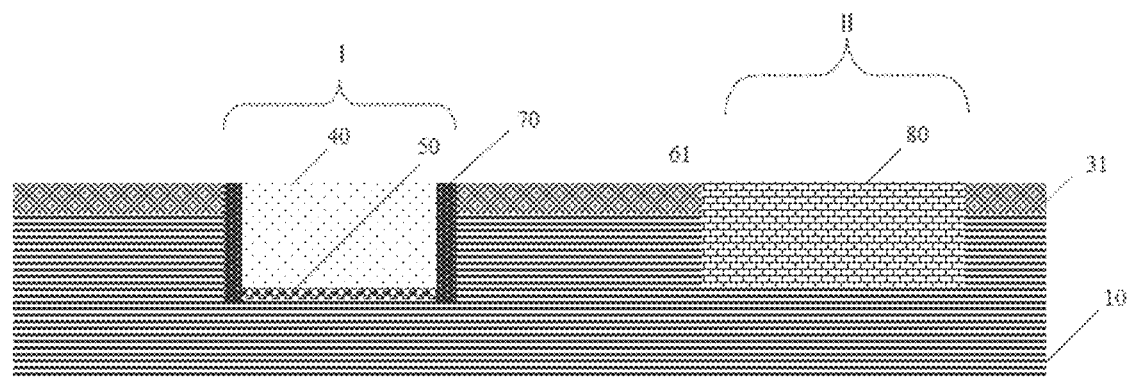

Following the selective formation of the III-N semiconductor device stack (40), the method (1000) further comprises manufacturing (500) a silicon semiconductor device (80) in the second region (II) (FIG. 2h; FIG. 3h).

In embodiments, this silicon semiconductor device (80) may be a field effect transistor (FET) or a diode. The manufacturing of this field effect transistor or diode is known to persons skilled in the art. In embodiments, this FET device may be a nanowire or a nanosheet-based device. Manufacturing (500) of the silicon semiconductor device (80) in the second region (II) may comprise, in embodiments, forming another recess (60) in the monocrystalline silicon base layer (30) such as, for instance, shown in FIG. 2g or FIG. 3g. This other recess (60) also has sidewalls (61) and a bottom (62) exposing the monocrystalline silicon base layer.

In embodiments, the provision of the III-N semiconductor device stack may comprise forming, on the layer of gamma $Al_2O_3$ (50), a buffer structure comprising one or more $Al_xGa_{1-x}N$ layers, wherein x 0≤x≤1. Formation of this buffer structure is known to the person skilled in the art. Above the buffer structure, a III-N semiconductor layer may be formed as known to a person skilled in the art. This III-N semiconductor layer is a layer suitable for activating the III-N semiconductor device that is to be completed in the first region (I). This III-N semiconductor layer may thus be the channel layer of the III-N semiconductor device.

In embodiments, the method may further comprise removing the interrupted mask layer (31) after the provision of the III-N semiconductor device stack in the recess. The removal may be done, in case of graphene being used as the 2D material, by applying a $O_3$ treatment at a temperature between room temperature and 300° C. to oxidize carbon to volatile carbon oxide species. Alternatively, it may be done by applying a $O_2$ plasma treatment at a temperature between room temperature and 300° C. to oxidize carbon to volatile carbon oxide species. Still, alternatively, the removal may be done by applying a H$_2$ treatment between room temperature and 300° C. to reduce carbon to volatile hydrocarbon species.

Figure 4A:
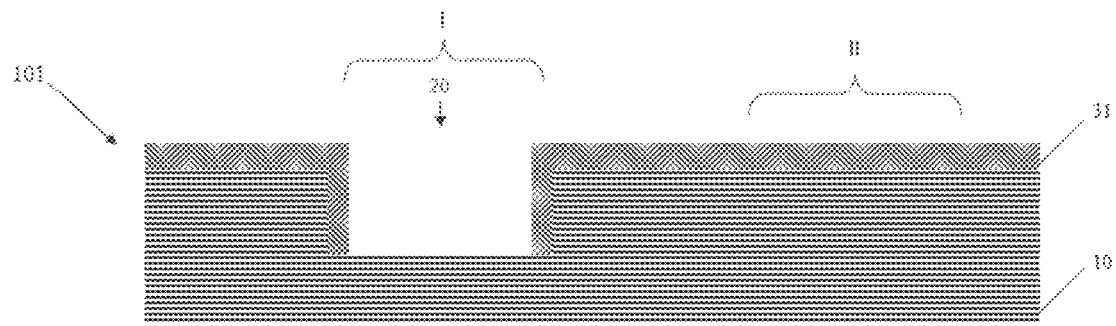
FIG. 4a and FIG. 4b represent the schematics of intermediate semiconductor structures according to example embodiments of a second aspect.
Figure 4B:
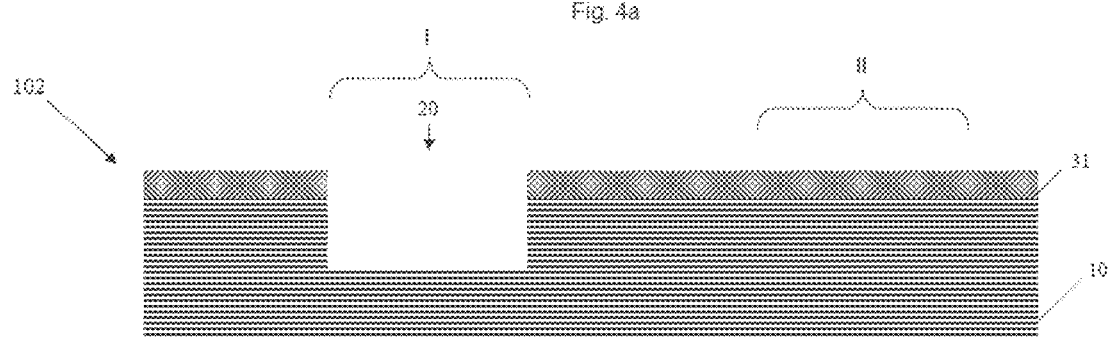

We now refer to FIG. 4a and FIG. 4b representing the schematics of an intermediate semiconductor structure (101; 102) according to a second aspect.

This intermediate semiconductor structure (101;102) is suitable for integrating a III-N semiconductor device with a silicon semiconductor device. It comprises a monocrystalline silicon base layer (10). In embodiments, the monocrystalline silicon base layer (10) may be a Si (111) layer or a Si (100) layer.

The use of the Si (100) layer facilitates easy manufacturing of the Si semiconductor device. However, either Si (111) or Si (100) layer can be used to accommodate the monolithic integration of the III-N semiconductor device with the Si semiconductor device according to the embodiments of this aspect.

In alternative embodiments, the monocrystalline silicon base layer (10) may be comprised in a substrate and provided on an insulator layer. This monocrystalline silicon base layer is then referred to as a silicon on insulator (SOI) layer. The insulator layer may be a layer of an oxide, such as a layer of silicon oxide. This substrate may further comprise a silicon bulk layer underneath the insulator layer. The silicon bulk layer may have (111) or (100) orientation. The monocrystalline silicon base layer (10) comprised in this substrate may be (100) oriented.

The intermediate semiconductor structure (101;102) further comprises a layer of a 2D material (30) on the monocrystalline silicon base layer (10). This layer of the 2D material (30) is interrupted (31) by a recess (20), wherein the recess has a bottom (22) exposing the monocrystalline silicon base layer (10). For monolithic integration of the III-N semiconductor device with the Si semiconductor device, the monocrystalline silicon base layer comprises a first region (I) for manufacturing the III-N semiconductor device and a second region (II) for manufacturing the silicon semiconductor device. As such, the recess (20), which interrupts the mask layer (30), is located in the first region (I).

In embodiments, the interrupted layer of the 2D material (31) may be in direct contact with the monocrystalline silicon base layer (10).

In embodiments, the interruption of the mask layer (30) may be due to the discontinuity in the mask layer (30) such that the monocrystalline silicon base layer (10) is exposed at the bottom (22) of the recess (20), such as shown, for instance, in FIG. 4a.

In alternative embodiments, the interruption of the mask layer (30) may be due to the discontinuity in the mask layer (30) such that the monocrystalline silicon base layer (10) is exposed on both the bottom (22) of the recess (20) and the sidewalls (21) of the recess (20) such as shown, for instance, in FIG. 4b.

In some embodiments, the bottom (22) of the recess (20) lies parallel to the top surface (11) of the monocrystalline silicon base layer (10).

Such an intermediate semiconductor structure (101;102) is possible due to the presence of the interrupted mask layer (31) comprising the 2D material since this will facilitate a selective deposition process in the recess (20). This is thanks to the highly inert, trap-free basal surface of the 2D material. In this way, the throughput of the manufacturing process is increased due to the fact that it enables cutting down on the necessity of applying further processes in an effort to remove the deposits which otherwise would have been formed as a result of non-selectivity. This, in turn, reduces the manufacturing costs of monolithic integration.

In embodiments, the 2D material comprised in the mask layer (30) may be graphene or a TMDC.

In embodiments, a single layer of 2D material may be sufficient to act as the mask layer (30).

Figure 5A:
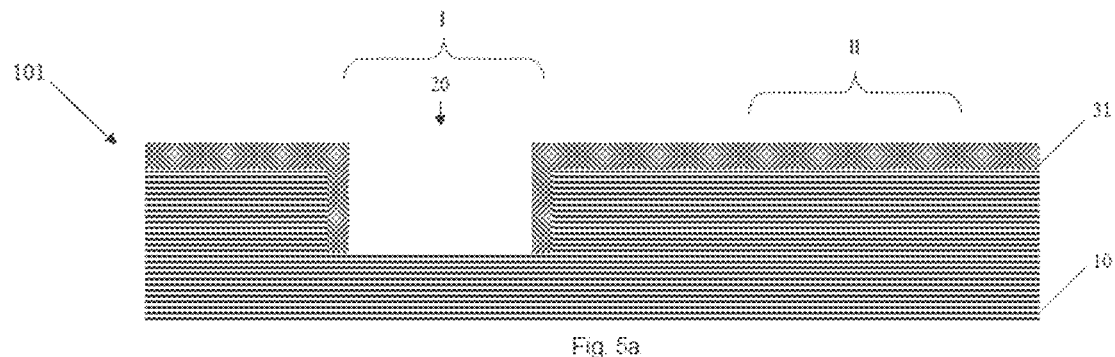
FIG. 5a and FIG. 5b represent the schematics of intermediate semiconductor structures according to example embodiments of a second aspect.
Figure 5B:
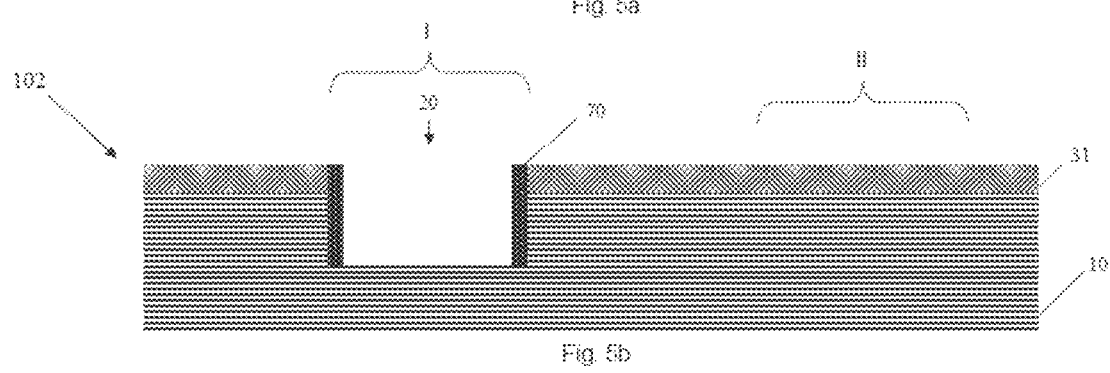

In embodiments, the recess (20) may have sidewalls (21) comprising a layer of a 2D material being the same as that of the 2D material comprised in the interrupted mask layer (31) (FIG. 5a), or it may be a different 2D material (FIG. 5b) than that comprised in the interrupted mask layer (31). Still, in further embodiments, the sidewalls may comprise a layer comprising mono alkyl silyl, di alkyl silyl, or tri alkyl silyl. In these further embodiments, thus, the interrupted mask layer (31) and the sidewalls (22) are different from each other in terms of the material.

For monolithic integration of the III-N semiconductor device with the silicon semiconductor device, a III-N device stack (40) needs to be provided in the recess (20). This III-N semiconductor device stack (40) may comprise a buffer structure comprising one or more Al$_x$Ga$_{1-x}$N layers, wherein x and y differ from each other and $0 \le x \le 1$, $0 \le y \le 1$ and above the buffer structure, an III-N semiconductor layer. The provision of the III-N semiconductor device stack (40) in the recess (20) can be done by using molecular beam epitaxy (MBE) process or metal organic chemical vapor deposition (MOCVD) process, which uses precursors. Having a recess (20) with the aforementioned sidewalls facilitates the elimination of the interaction of the precursors of the MBE process or the MOCVD process with the monocrystalline silicon base layer (10). If the interaction of the precursors with the monocrystalline silicon base layer (10) is not eliminated, it can lead to the formation of defects in the monocrystalline silicon base layer (10) and the III-N stack, which then degrades the electrical and structural reliability of the III-N semiconductor device.

Figure 6A:
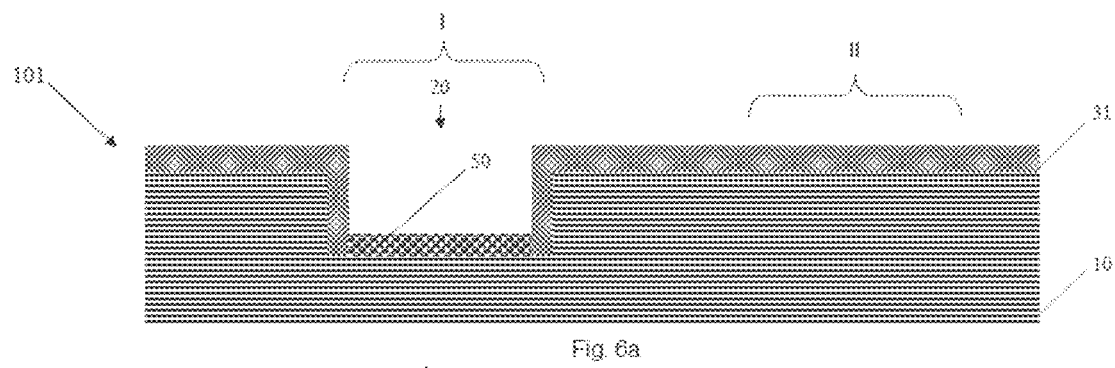
FIG. 6a and FIG. 6b represent the schematics of intermediate semiconductor structures according to example embodiments of a second aspect.
Figure 6B:
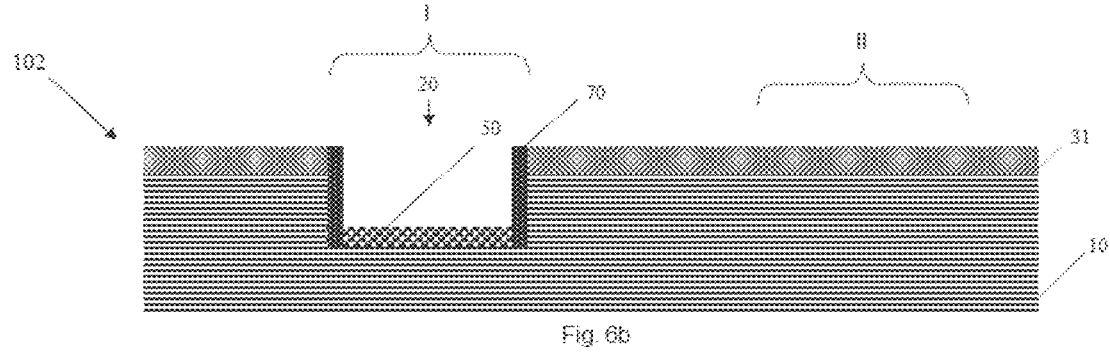

In embodiments, the intermediate structure (101;102) further comprises a layer of gamma-Al$_2$O$_3$ (50) at the bottom (22) of the recess (20), such as shown, for instance, in FIG. 6a or FIG. 6b.

Such an intermediate semiconductor structure (101;102) further comprising the layer of gamma-Al$_2$O$_3$ (50) at the bottom (22) of the recess (20) further facilitates the monolithic integration of a III-N semiconductor device with a silicon semiconductor device on a common, such as for example the same, monocrystalline silicon base layer (10). Typically, monolithic integration involves manufacturing devices on separate substrates followed by transferring one or more of the devices onto the substrate of another device. Such a transfer is a costly and time-consuming process. The intermediate semiconductor structure (101:102) thus reduces manufacturing costs since it allows for integrating them on the common monocrystalline silicon base layer; thus, eliminating the need for transfer. This is because by using the layer of gamma-Al$_2$O$_3$ (50) at the bottom (22) of the recess (20), the III-N semiconductor device can be manufactured independently of the crystal orientation of the monocrystalline silicon base layer (10). As such, the crystal orientation of the monocrystalline silicon base layer (10) can be chosen such as to support manufacturing of the silicon semiconductor device in an easy and convenient way, thus then allowing integration of both types of devices on the common monocrystalline silicon base layer.

For monolithic integration of a III-N semiconductor device with a silicon semiconductor device (80), such an intermediate semiconductor structure is further facilitates manufacturing the III-N semiconductor device prior to manufacturing the silicon semiconductor device (80). The manufacturing of the III-N semiconductor device typically requires a high thermal budget raising to temperatures 1000° C. or more. Such a temperature budget is detrimental for the manufacturing of the silicon semiconductor device. By being able to manufacture the III-N device prior to the manufacturing of the silicon semiconductor device, the thermal budget required for manufacturing the III-N semiconductor device does not challenge the reliability of the silicon semiconductor device anymore (FIG. 7a; FIG. 7b).

In embodiments, the silicon semiconductor device (80) may be a field effect transistor or a diode. This FET device may be a nanowire or a nanosheet-based device as known to persons skilled in the art.

Figure 7A:
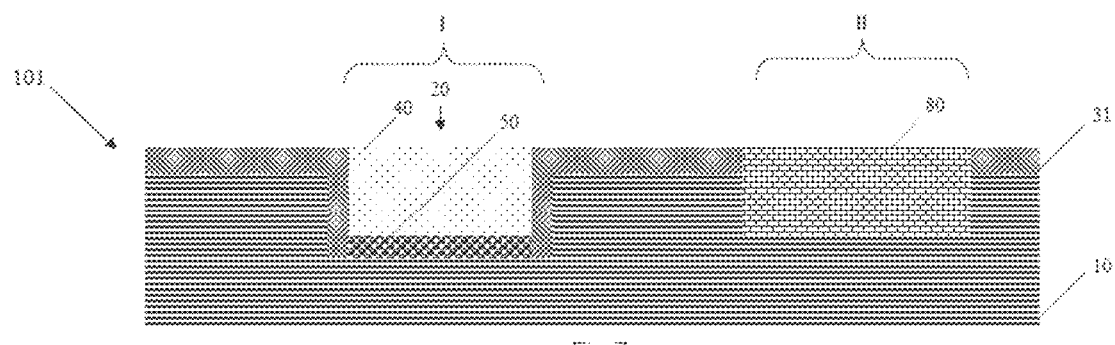
FIG. 7a to FIG. 7b represent the schematics of intermediate semiconductor structures according to example embodiments of a second aspect.
Figure 7B:
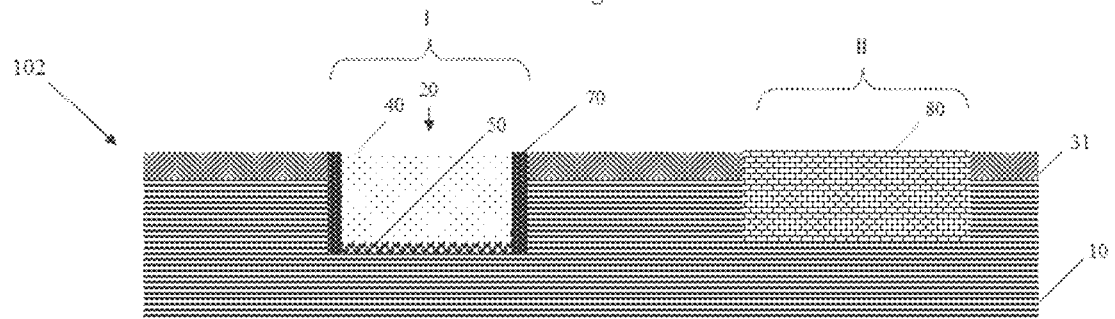

Thus, the intermediate semiconductor structure (101;102) may further be used to monolithically integrate the silicon semiconductor device (80) on the common monocrystalline silicon base layer (10) after completing the manufacturing of the III-N semiconductor device (FIG. 7a; FIG. 7b). In embodiments, this may be done by, for instance, forming another recess (60) such as, for instance, shown in FIG. 2g or FIG. 3g in the monocrystalline silicon base layer (10) in the second region (II).

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for manufacturing a semiconductor structure, the semiconductor structure comprising a III-N semiconductor device in a first region (I) and a silicon semiconductor device in a second region (II), the method comprising:
   providing a monocrystalline silicon base layer comprising a first region (I) for manufacturing the III-N semiconductor device and a second region (II) for manufacturing the silicon semiconductor device;
   providing, on the monocrystalline silicon base layer, a mask layer, wherein the mask layer is interrupted in the first region (I) by a recess in the monocrystalline silicon base layer, wherein the mask layer comprises a 2D material;
   forming, selectively, a layer of gamma-$Al_2O_3$ at a bottom of the recess by a first growth process;
   forming, selectively on the layer of gamma-$Al_2O_3$, a III-N semiconductor device stack by a second growth process; and
   manufacturing, in the second region (II), and at least partially, a silicon semiconductor device.

2. The method according to claim 1, wherein the first growth process and the second growth process are performed as a single in-situ growth process.

3. The method according to claim 2, wherein the single in-situ growth process is performed at a temperature lower than 1000° C.

4. The method according to claim 3, wherein the 2D material comprised in the mask layer is a transition metal dichalcogenide.

5. The method according to claim 2, wherein the mask layer is a multi-layer stack of 2D materials.

6. The method according to claim 2, wherein the mask layer comprises a top-most layer comprising a dielectric material, wherein the top-most layer is provided on a single layer of or on a multi-layer stack of 2D materials.

7. The method according to claim 6, wherein the provision of the interrupted mask layer comprises:
   forming a recess in the monocrystalline silicon base layer in the first region (I);
   depositing the mask layer conformally on the monocrystalline silicon base layer; and
   interrupting the mask layer by removing the mask layer selectively from the bottom of the recess, thereby exposing the monocrystalline silicon base layer.

8. The method according to claim 7, wherein the method further comprises, after exposure of the monocrystalline silicon base layer at the bottom of the recess, removing one or more layers from a top of the mask layer so as to leave at least one layer in the mask layer.

9. The method according to claim 1, wherein the provision of the interrupted mask layer comprises:
   forming a recess in the monocrystalline silicon base layer in the first region (I);
   depositing the mask layer conformally on the monocrystalline silicon base layer; and
   interrupting the mask layer by removing the mask layer selectively from the bottom of the recess, thereby exposing the monocrystalline silicon base layer.

10. The method according to claim 1, wherein the mask layer comprises a top-most layer comprising a dielectric material, wherein the top-most layer is provided on a single layer of or on a multi-layer stack of 2D materials.

11. The method according to claim 1, wherein the mask layer is a multi-layer stack of 2D materials.

12. The method according to claim 1, wherein the provision of the interrupted mask layer comprises:
   providing a mask layer on the monocrystalline silicon base layer; and
   interrupting the mask layer by forming a recess in the monocrystalline silicon base layer in the first region (I), thereby exposing the monocrystalline silicon base layer.

13. The method according to claim 11, wherein after exposure of the monocrystalline silicon base layer at the bottom of the recess, the method further comprises:
   removing one or more layers from a top of the mask layer so as to leave at least one layer in the mask layer; and
   wherein after removing the one or more layers of the mask layer and before selectively forming the layer of the gamma-$Al_2O_3$, the method further comprises:
   providing a layer of a passivating material on sidewalls of the recess, thereby eliminating interaction of precursors of the first and the second growth processes with the sidewalls of the recess in the monocrystalline silicon base layer.

14. The method according to claim 13, wherein the passivating material is the same as or different from the 2D material comprised in the mask layer.

15. The method according to claim 13, wherein the layer of the passivating material is a layer comprising at least one of: mono alkyl silyl, di alkyl silyl, or tri alkyl silyl.

16. The method according to claim 15, wherein the layer of the passivating material extends outside the recess and on the mask layer.

* * * * *